(12) United States Patent
Tracy et al.

(10) Patent No.: US 10,505,068 B2
(45) Date of Patent: Dec. 10, 2019

(54) TRI-LAYER SEMICONDUCTOR STACKS FOR PATTERNING FEATURES ON SOLAR CELLS

(71) Applicant: SunPower Corporation, San Jose, CA (US)

(72) Inventors: Kieran Mark Tracy, San Jose, CA (US); David D. Smith, Campbell, CA (US); Venkatasubramani Balu, Santa Clara, CA (US); Asnat Masad, Mountain View, CA (US); Ann Waldhauer, La Honda, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 16/284,988

(22) Filed: Feb. 25, 2019

(65) Prior Publication Data

US 2019/0189813 A1 Jun. 20, 2019

Related U.S. Application Data

(62) Division of application No. 15/089,381, filed on Apr. 1, 2016, now Pat. No. 10,217,878.

(51) Int. Cl.
*H01L 31/18* (2006.01)
*H01L 31/0236* (2006.01)
(Continued)

(52) U.S. Cl.
CPC .... *H01L 31/1804* (2013.01); *H01L 31/02363* (2013.01); *H01L 31/022425* (2013.01);
(Continued)

(58) Field of Classification Search
CPC ..... H01L 31/022425; H01L 31/022441; H01L 31/022458; H01L 31/0516; H01L 31/0682;
(Continued)

(56) References Cited

U.S. PATENT DOCUMENTS

| | | | | |
|---|---|---|---|---|
| 5,330,918 A | * | 7/1994 | Dubbelday | ......... H01L 31/0475 |
| | | | | 136/249 |
| 6,037,219 A | | 3/2000 | Lin et al. | |

(Continued)

FOREIGN PATENT DOCUMENTS

| | | |
|---|---|---|
| EP | 0725447 | 8/1996 |
| WO | WO 2014204182 | 12/2014 |
| WO | WO 2015064354 | 5/2015 |

OTHER PUBLICATIONS

International Search Report and Written Opinion from PCT/US2017/025571 dated Jun. 29, 2017, 10 pgs.

(Continued)

*Primary Examiner* — Lindsey A Bernier
(74) *Attorney, Agent, or Firm* — Schwabe, Williamson & Wyatt, P.C.

(57) ABSTRACT

Tri-layer semiconductor stacks for patterning features on solar cells, and the resulting solar cells, are described herein. In an example, a solar cell includes a substrate. A semiconductor structure is disposed above the substrate. The semiconductor structure includes a P-type semiconductor layer disposed directly on a first semiconductor layer. A third semiconductor layer is disposed directly on the P-type semiconductor layer. An outermost edge of the third semiconductor layer is laterally recessed from an outermost edge of the first semiconductor layer by a width. An outermost edge of the P-type semiconductor layer is sloped from the outermost edge of the third semiconductor layer to the outermost edge of the third semiconductor layer. A conductive contact structure is electrically connected to the semiconductor structure.

20 Claims, 7 Drawing Sheets

(51) Int. Cl.
*H01L 31/0747* (2012.01)
*H01L 31/0224* (2006.01)
*H01L 31/05* (2014.01)
*H01L 31/068* (2012.01)
*H01L 31/20* (2006.01)
*H01L 31/0352* (2006.01)
*H01L 31/0745* (2012.01)

(52) U.S. Cl.
CPC ........... *H01L 31/022441* (2013.01); *H01L 31/022458* (2013.01); *H01L 31/035281* (2013.01); *H01L 31/0516* (2013.01); *H01L 31/0682* (2013.01); *H01L 31/0745* (2013.01); *H01L 31/0747* (2013.01); *H01L 31/18* (2013.01); *H01L 31/202* (2013.01); *Y02E 10/50* (2013.01); *Y02E 10/546* (2013.01); *Y02E 10/547* (2013.01); *Y02E 10/548* (2013.01)

(58) Field of Classification Search
CPC . H01L 31/0684; H01L 31/18; H01L 31/1804; H01L 31/202; Y02E 10/546; Y02E 10/547; Y02E 10/548
See application file for complete search history.

(56) References Cited

U.S. PATENT DOCUMENTS

| | | |
|---|---|---|
| 8,790,957 B2 | 7/2014 | Li et al. |
| 2005/0062041 A1 | 3/2005 | Terakawa et al. |
| 2010/0276773 A1 | 11/2010 | Sasagawa et al. |
| 2011/0001051 A1 | 1/2011 | Tanaka |
| 2011/0023956 A1 | 2/2011 | Harder |
| 2011/0214719 A1 | 9/2011 | Li et al. |
| 2012/0038018 A1 | 2/2012 | Yamada et al. |
| 2013/0291937 A1 | 11/2013 | Mangersnes et al. |
| 2014/0020752 A1 | 1/2014 | Arimoto et al. |
| 2016/0104807 A1 | 4/2016 | Jeong |
| 2016/0233368 A1 | 8/2016 | Ogane |

OTHER PUBLICATIONS

International Preliminary Report on Patentability for International Application No. PCT/US2017/025571, dated Oct. 2, 2018, 5 pgs.
Examination Report for Patent Application in Germany No. 11 2017 001 811.0 dated Dec. 7, 2018, 14 pgs. with English translation of the Examination Report.

* cited by examiner

TRI-LAYER SEMICONDUCTOR STACKS FOR PATTERNING FEATURES ON SOLAR CELLS

CROSS-REFERENCE TO RELATED APPLICATIONS

This application is a Divisional of U.S. patent application Ser. No. 15/089,381, filed on Apr. 1, 2016, the entire contents of which are hereby incorporated by reference herein.

TECHNICAL FIELD

Embodiments of the present disclosure are in the field of renewable energy and, in particular, methods of fabricating solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
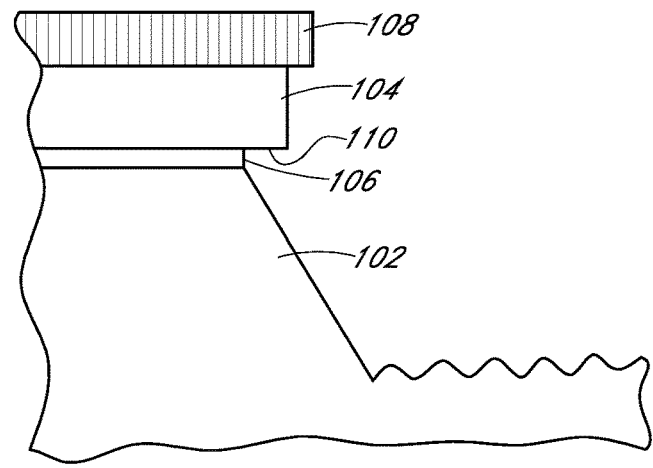
FIG. 1A illustrates a cross-sectional view of a solar cell having a single semiconductor layer emitter region.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Tri-layer semiconductor stacks for patterning features on solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed here are solar cells. In one embodiment, a solar cell includes a substrate. A semiconductor structure is disposed above the substrate. The semiconductor structure includes a P-type semiconductor layer disposed directly on a first semiconductor layer. A third semiconductor layer is disposed directly on the P-type semiconductor layer. An outermost edge of the third semiconductor layer is laterally recessed from an outermost edge of the first semiconductor layer by a width. An outermost edge of the P-type semiconductor layer is sloped from the outermost edge of the first semiconductor layer to the outermost edge of the third semiconductor layer. A conductive contact structure is electrically connected to the semiconductor structure.

In another embodiment, a solar cell includes a substrate. A semiconductor structure is disposed above the substrate. The semiconductor structure includes a second semiconductor layer disposed directly on a first semiconductor layer. A third semiconductor layer is disposed directly on the second semiconductor layer. An outermost edge of the third semiconductor layer has a non-reentrant profile. An outermost edge of the second semiconductor layer has a non-reentrant profile extending beyond the outermost edge of the third semiconductor layer by a width. An outermost edge of the first semiconductor layer has a non-reentrant profile and does not undercut the second semiconductor layer. The non-reentrant profiles of the first and third semiconductor layers are steeper than the non-reentrant profile of the second semiconductor layer. A conductive contact structure electrically connected to the semiconductor structure.

Also, disclosed herein are methods of fabricating solar cells. In one embodiment, a method of fabricating a solar cell includes forming a first semiconductor layer above a substrate. The method also includes forming a P-type semiconductor layer directly on the first semiconductor layer. The method also includes forming a third semiconductor layer directly on the P-type semiconductor layer. The method also includes forming a mask layer directly on the third semiconductor layer. The method also includes patterning the mask layer. The method also includes etching the third semiconductor layer, the P-type semiconductor layer, and the first semiconductor layer to provide a semiconductor structure having an outermost edge of the third semiconductor layer laterally recessed from an outermost edge of the first semiconductor layer by a width. An outermost edge of the P-type semiconductor layer is sloped from the outermost edge of the first semiconductor layer to the outermost edge of the third semiconductor layer.

In accordance with one or more embodiments described herein, a three layer semiconductor film stack is implemented in solar cell manufacturing to avoid overhang associated with selective etching processes.

Previous approaches have included a single semiconductor layer for an emitter region of a solar cell. As an example, FIG. 1A illustrates a cross-sectional view of a solar cell having a single semiconductor layer emitter region. Referring to FIG. 1A, a portion of a solar cell includes a substrate 102. A single semiconductor layer 104 is disposed above the substrate 102, e.g., on a thin dielectric layer 106 formed on the substrate 102. A mask layer 108 is disposed on the single semiconductor layer 106. Following a patterning and wet etching process, the single semiconductor layer 104 undercuts mask 108 and, perhaps most significantly, creates an overhang region 110 above the substrate 102. Such an overhand region 110 may prove problematic in subsequent processing operations.

Figure 1B:
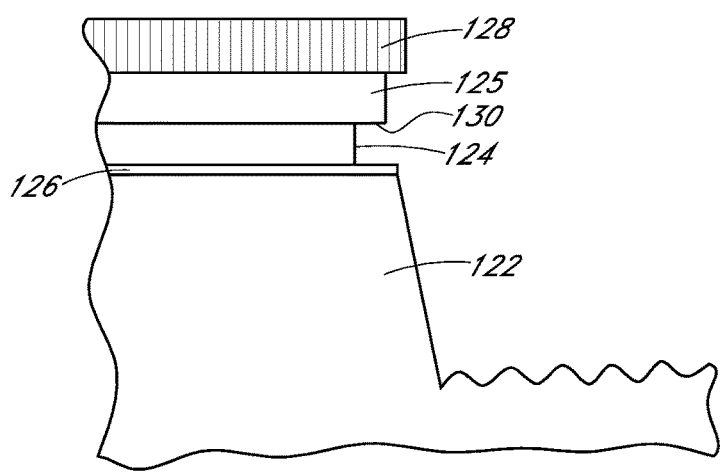
FIG. 1B illustrates a cross-sectional view of a solar cell having a stack of two semiconductor layers for an emitter region.

In another previous approach, a two-layer region is used to keep dopants away from the tunneling dielectric layer. As an example, FIG. 1B illustrates a cross-sectional view of a solar cell having a stack of two semiconductor layers for an emitter region. Referring to FIG. 1B, a portion of a solar cell includes a substrate 122. Two semiconductor layers 124 and 125 are disposed above the substrate 122, e.g., on a thin dielectric layer 126 formed on the substrate 122. The lower layer 124 may be undoped or lightly doped to hinder dopant poisoning of the thin dielectric layer 126. A mask layer 128 is disposed on the upper semiconductor layer 125. Following a patterning and wet etching process, the semiconductor layers 124 and 125 undercut mask 128 and, perhaps most significantly, create an overhang region 130. Furthermore, the lower semiconductor layer 124 undercuts the upper semiconductor layer 125. Such an overhand region 130 and lower layer undercut may prove problematic in subsequent processing operations.

Figure 1C:
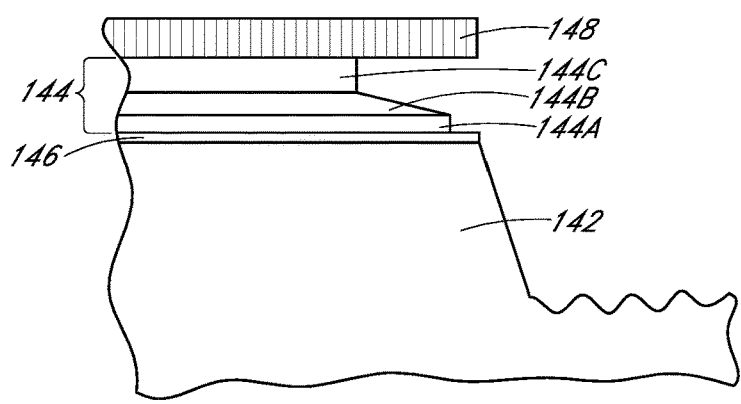
FIG. 1C illustrates a cross-sectional view of a solar cell having a stack of three semiconductor layers for an emitter region, in accordance with an embodiment of the present disclosure.

By contrast, to FIGS. 1A and 1B, FIG. 1C illustrates a cross-sectional view of a solar cell having a stack of three semiconductor layers for an emitter region, in accordance with an embodiment of the present disclosure. Referring to FIG. 1C, a portion of a solar cell includes a substrate 142. A stack 144 includes three semiconductor layers 144A, 144B and 144C disposed above the substrate 142, e.g., on a thin dielectric layer 146 formed on the substrate 142. The lowest layer 144A may be undoped or lightly doped to hinder dopant poisoning of the thin dielectric layer 146. The uppermost layer 144C may be undoped or lightly doped to hinder unfavorable interaction with a subsequent laser ablation process. The middle layer 144B is doped P-type to provide a P-type conductivity for the stack 144. A mask layer 148 is disposed on the uppermost semiconductor layer 144C. Following a patterning and wet etching process, the semiconductor stack 144 undercuts mask 128 and, perhaps most significantly, does not form an overhang region within the stack 144. Furthermore, the lowest semiconductor layer 144A does not undercut the middle semiconductor layer 144B, nor does the middle semiconductor layer 144B undercut the uppermost semiconductor layer 144C.

Figure 2:
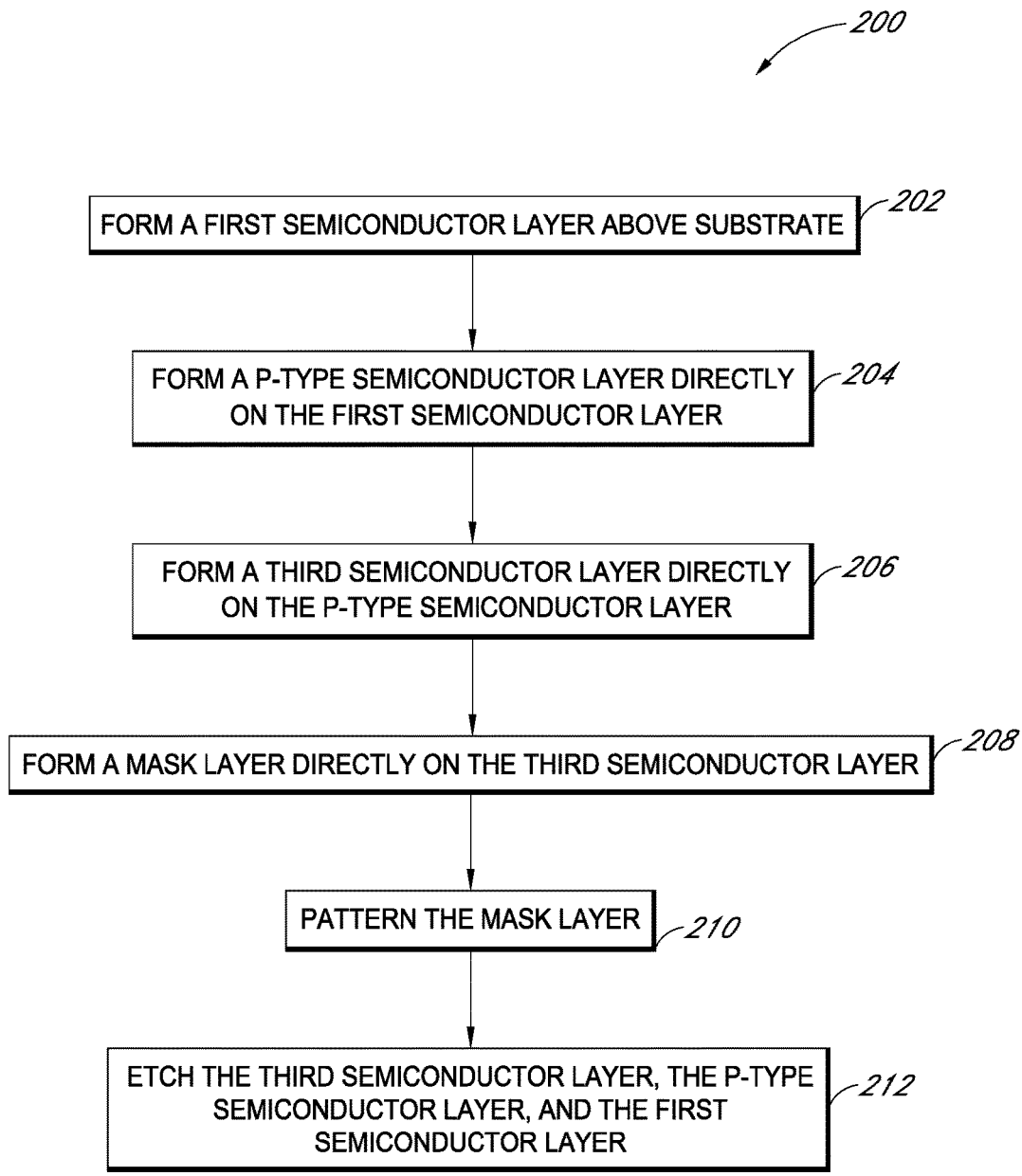
FIG. 2 is a flowchart listing operations in a method of fabricating a solar cell, in accordance with an embodiment of the present disclosure.

FIG. 2 is a flowchart listing operations in a method of fabricating a solar cell, in accordance with an embodiment of the present disclosure. FIGS. 3A-3G and 3G' illustrate cross-sectional views of various stages in the fabrication of a solar cell, as corresponding to the flowchart of FIG. 2, in accordance with an embodiment of the present disclosure.

Figure 3A:
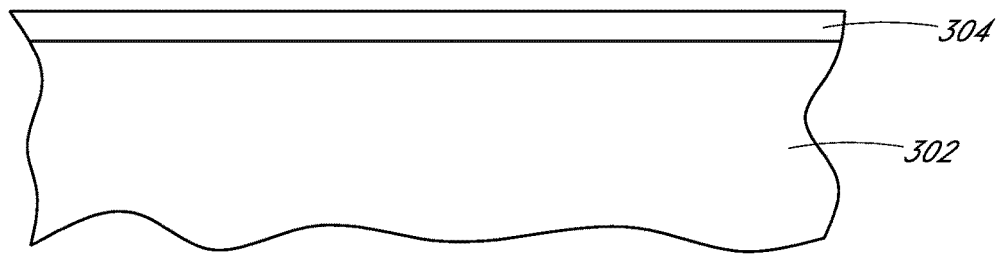
FIGS. 3A-3G and 3G' illustrate cross-sectional views of various stages in the fabrication of a solar cell, as corresponding to the flowchart of FIG. 2, in accordance with an embodiment of the present disclosure.

Referring to operation 202 of flowchart 200 and to corresponding FIG. 3A, a method of fabricating a solar cell includes forming a first semiconductor layer 304 above a substrate 302. In an embodiment, the first semiconductor layer 304 is formed on a thin dielectric layer formed on the substrate 302 (not shown), while in other embodiments the first semiconductor layer 304 is formed directly on the substrate 302.

Figure 3B:
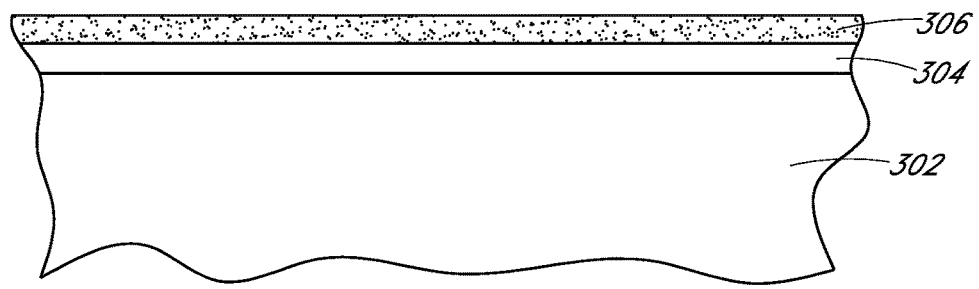

Referring to operation 204 of flowchart 200 and to corresponding FIG. 3B, the method of fabricating the solar cell further includes forming a second semiconductor layer 306 directly on the first semiconductor layer 304. In an embodiment, the second semiconductor layer is a P-type semiconductor layer.

Figure 3C:
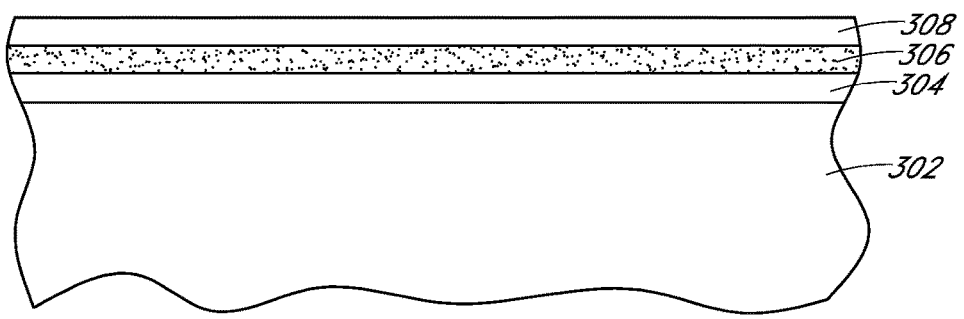

Referring to operation 206 of flowchart 200 and to corresponding FIG. 3C, the method of fabricating the solar cell further includes forming a third semiconductor layer 308 directly on the second (P-type) semiconductor layer 306.

Figure 3D:
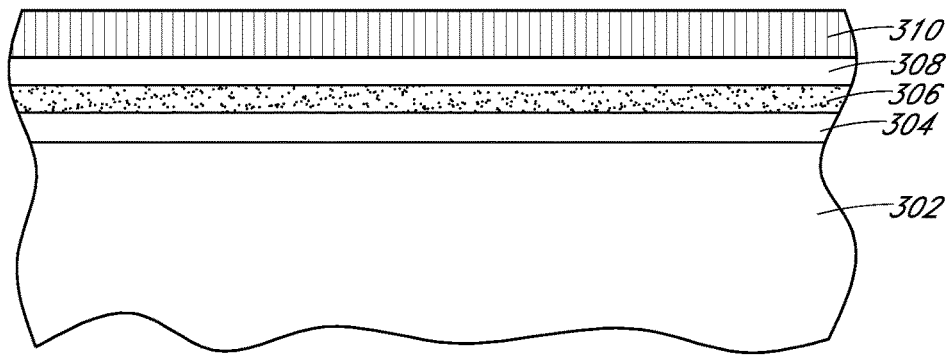

Referring to operation 208 of flowchart 200 and to corresponding FIG. 3D, the method of fabricating the solar cell further includes forming a mask layer 310 directly on the third semiconductor layer 308. In an embodiment, the mask layer 310 is a bottom-ant-reflective coating (BARC) layer, such as a silicon nitride layer.

Figure 3E:
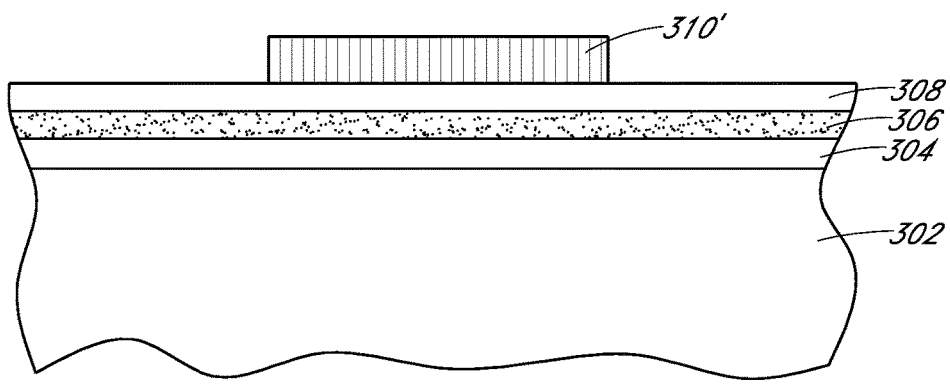

Referring to operation 210 of flowchart 200 and to corresponding FIG. 3E, the method of fabricating the solar cell further includes patterning the mask layer 310 to provide a patterned mask layer 310'. In an embodiment, the patterning is performed using a laser ablation process. In another embodiment, the patterning is performed using a lithography and etch process.

Figure 3F:
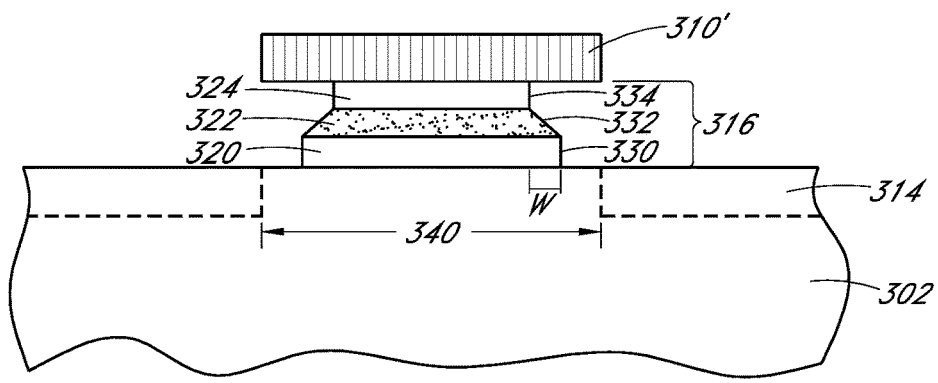

Referring to operation 212 of flowchart 200 and to corresponding FIG. 3F, the method of fabricating the solar cell further includes etching the third semiconductor layer 308, the second (P-type) semiconductor layer 306, and the first semiconductor layer 304 to provide a semiconductor structure 316 below the patterned mask layer 310'. The semiconductor structure 316 includes a first semiconductor structure layer 320, a second (P-Type) semiconductor structure layer 322, and a third semiconductor structure layer 324. In an embodiment, as depicted in FIG. 3F, an outermost edge 334 of the third semiconductor structure layer is laterally recessed (e.g., inward along direction 340) from an outermost edge 330 of the first semiconductor structure layer 320 by a width (W). An outermost edge 332 of the second (P-type) semiconductor structure layer 322 is sloped from the outermost edge 330 of the first semiconductor structure layer 324 to the outermost edge 334 of the third semiconductor structure layer 320.

It is to be appreciated that, as is depicted in FIG. 3F, in accordance with an embodiment of the present disclosure, the above described recessing occurs during etching at both sides of the patterned mask layer 310' FIG. 3E. In an embodiment, etching the third semiconductor layer 308, the second (P-type) semiconductor layer 306, and the first semiconductor layer 304 to provide a semiconductor structure 316 includes performing a wet etching process. In one such embodiment, the wet etching process involves use of a wet etchant such as, but not limited to, an aqueous solution of TMAH or an aqueous solution of KOH. Not to be bound by theory, in accordance with an embodiment of the present invention, the sloped portion of the outermost edge 332 of the second (P-type) semiconductor structure layer 322 effectively creates a moving triangle that recesses during etching. The moving triangle inhibits undercutting by the first semiconductor layer 320 and prevents formation of an overhang region in the three-layer stack 320, 322 and 324. In an embodiment, the substrate 302 is also partially patterned during the formation of semiconductor structure 316. The partial patterning of substrate 302 forms trenches 314 in substrate 302, as is depicted in FIG. 3F.

Furthermore, in an embodiment, the semiconductor structure 316 is subsequently subjected to an annealing process, which may crystallize or further crystallize one or more layers of the semiconductor structure 316. In one embodiment, an annealing process is performed prior to subsequent conductive contact formation. In another embodiment, an annealing process is performed during or subsequent to conductive contact formation. In other embodiments, the semiconductor structure 316 is not subsequently subjected substantial annealing conditions. In either case, whether or not subjected to subsequent annealing conditions, as used throughout, the semiconductor structure is referred to as semiconductor structure 316 in the embodiments described below.

Figure 3G:
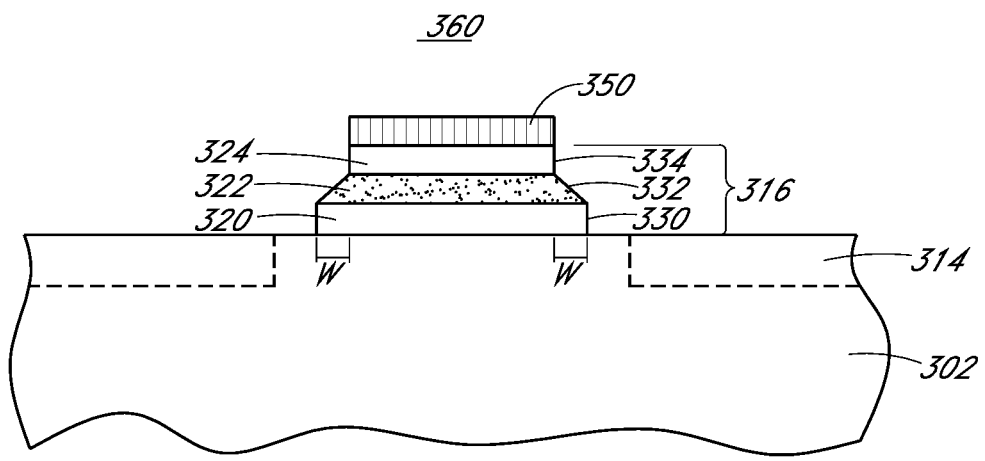
Figure 3G:
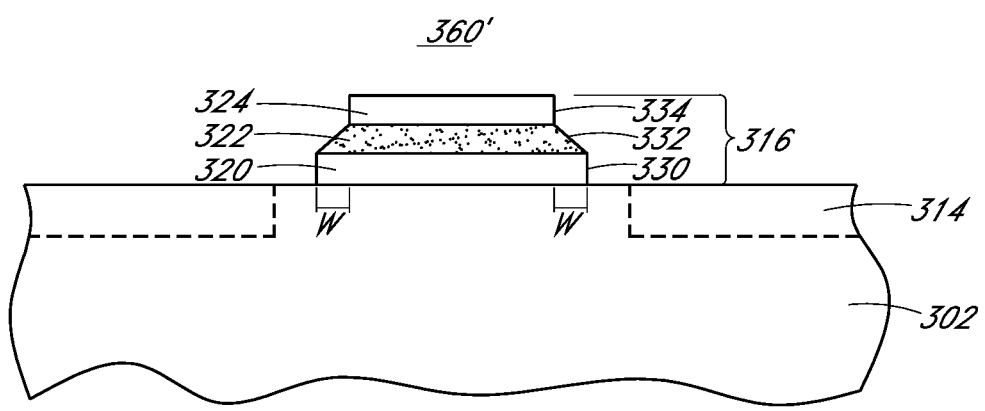

In an embodiment, referring to FIG. 3G, the patterned mask layer 310' is trimmed to provide trimmed mask 350 to reduce or altogether remove overhang over the semiconductor structure 316. The trimmed mask 350 may be retained on the semiconductor structure 316 in a finalized solar cell, although the trimmed mask may be thinned as compared to the original mask thickness, as is depicted in FIG. 3G. In one such embodiment, an opening is subsequently formed in the trimmed mask 350, e.g., by laser ablation, through which a conductive contact is ultimately formed. In a specific such embodiment, the laser ablating penetrates a portion of the third semiconductor structure layer 324 but does not penetrate through to the second (P-type) semiconductor structure layer 322. In another embodiment, referring to FIG. 3G', the patterned mask layer 310' is altogether removed from the semiconductor structure 316.

It is to be appreciated that semiconductor structure 316 may be included in a solar cell structure. In a first exemplary embodiment, referring to FIGS. 3G and 3G', a solar cell 360 or 360' includes a substrate 302. A semiconductor structure 316 is disposed above the substrate 302. The semiconductor structure 316 includes a P-type semiconductor layer 322 disposed directly on a first semiconductor layer 320. A third semiconductor layer 324 is disposed directly on the P-type semiconductor layer 322. An outermost edge 334 of the third semiconductor layer 324 is laterally recessed from an outermost edge 334 of the first semiconductor layer 320 by a width (W). An outermost edge 332 of the P-type semiconductor layer 322 is sloped from the outermost edge 330 of the first semiconductor layer 320 to the outermost edge 334 of the third semiconductor layer 324.

In an embodiment, a conductive contact structure is electrically connected to the semiconductor structure 316, examples of which are described below in association with FIG. 4 and FIGS. 5A-5C. In one such embodiment, the conductive contact structure is disposed in an opening of an anti-reflective coating layer disposed over the semiconductor structure 316.

In an embodiment, the first semiconductor layer 320 has a thickness approximately equal to a thickness of the P-type semiconductor layer 322 and approximately equal to a thickness of the third semiconductor layer 324. In an embodiment, the P-type semiconductor layer 322 has a thickness greater than approximately 10% but less than approximately 90% of a total thickness of the semiconductor structure 316. In an embodiment, none of the first semiconductor layer 320, the P-type semiconductor layer 322, and the third semiconductor layer 324 has a thickness less than approximately 10% of a total thickness of the semiconductor structure 316. In an embodiment, the first semiconductor layer 320 is a first intrinsic silicon layer, the P-type semiconductor layer 322 is a boron-doped silicon layer, and the third semiconductor layer 324 is a second intrinsic silicon layer. In one such embodiment, the first intrinsic silicon layer 320, the P-type semiconductor layer 322, and the second intrinsic silicon layer 324 are amorphous layers. In another such embodiment, the first intrinsic silicon layer 320, the P-type semiconductor layer 322, and the second intrinsic silicon layer 324 are polycrystalline layers. In yet another such embodiment, the first intrinsic silicon layer 320 and the second intrinsic silicon layer 324 each have a total dopant concentration of less than approximately 1E18 atoms/cm$^3$, or less than approximately 1E17 atoms/cm$^3$, or less than approximately 1E16 atoms/cm$^3$, and the P-type semiconductor layer 322 has a total boron concentration of greater than approximately 2E19 atoms/cm$^3$ or greater than approximately 5E19 atoms/cm$^3$.

In an embodiment, the semiconductor structure 316 is disposed on a tunneling dielectric layer disposed on the substrate, examples of which are described below in association with FIG. 4 and FIGS. 5A-5C. In an embodiment, the semiconductor structure 316 is a P-type emitter region of the solar cell 360 or 360'.

In a second exemplary embodiment, referring again to FIGS. 3G and 3G', a solar cell 360 or 360' includes a substrate 302. A semiconductor structure 316 is disposed above the substrate 302. The semiconductor structure 316 includes a second semiconductor layer 322 disposed directly on a first semiconductor layer 320. A third semiconductor layer 324 is disposed directly on the second semiconductor layer 322. An outermost edge 334 of the third semiconductor layer 324 has a non-reentrant profile. An outermost edge 332 of the second semiconductor layer 322 has a non-reentrant profile extending beyond the outermost edge 334 of the third semiconductor layer 324 by a width (W). An outermost edge 330 of the first semiconductor layer 320 has a non-reentrant profile and does not undercut the second semiconductor layer 322. The non-reentrant profiles 330 and 334 of the first and third semiconductor layers 320 and 325, respectively, are steeper than the non-reentrant profile 332 of the second semiconductor layer 322.

In an embodiment, a conductive contact structure is electrically connected to the semiconductor structure 316, examples of which are described below in association with FIG. 4 and FIGS. 5A-5C. In an embodiment, the second semiconductor layer 322 is a P-type silicon layer. In one such embodiment, the first 320 and the third 324 semiconductor layers each have a total dopant concentration of less than approximately 1E18 atoms/cm$^3$, and the P-type silicon layer has a total boron concentration of greater than approximately 2E19 atoms/cm$^3$.

Figure 4:
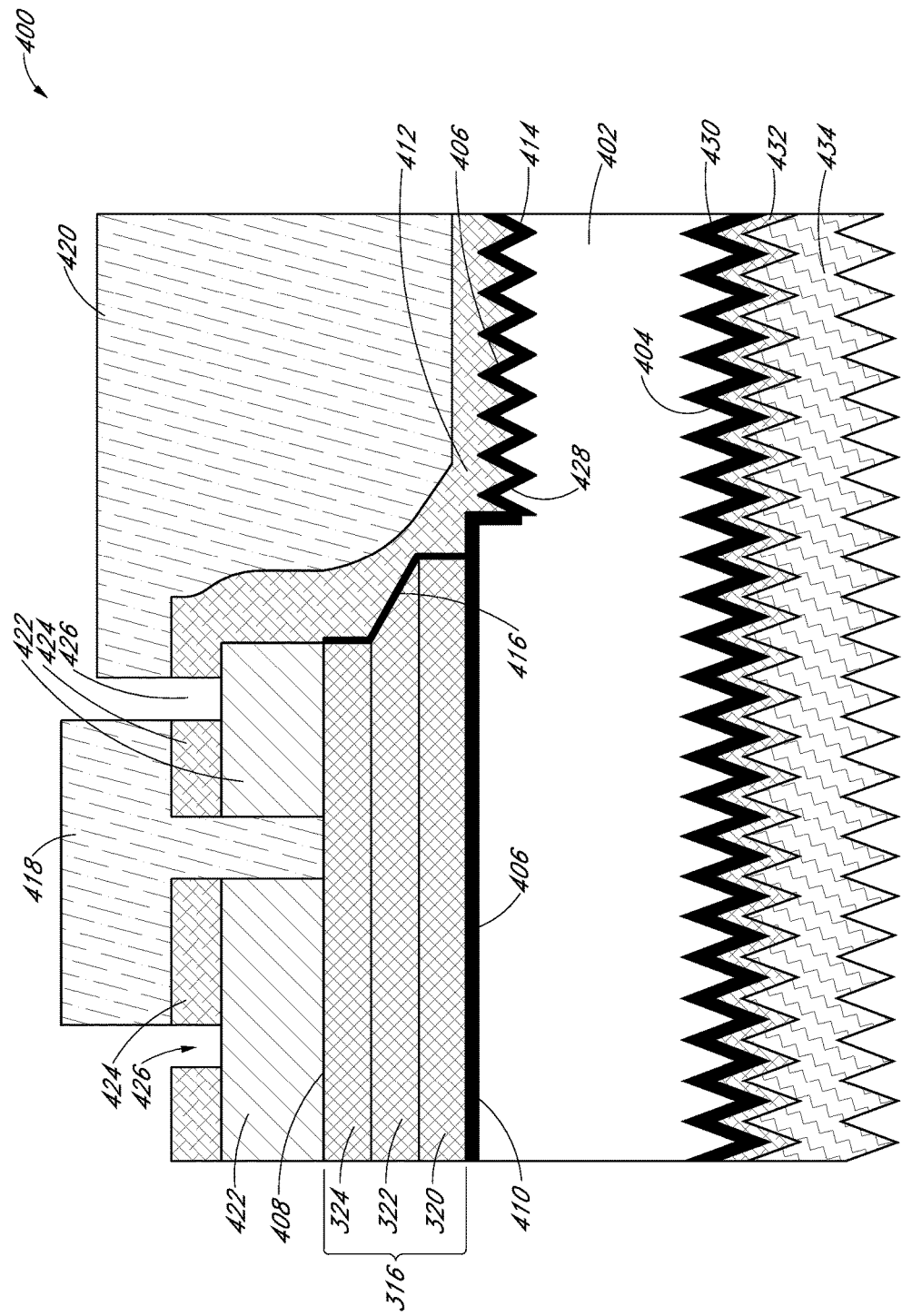
FIG. 4 illustrates a cross-sectional view of a portion of a back contact solar cell having structurally differentiated semiconductor regions, in accordance with an embodiment of the present disclosure.

In another aspect, a solar cell has differentiated P-type and N-type architectures. FIG. 4 illustrates a cross-sectional view of a portion of a back contact solar cell having structurally differentiated semiconductor regions, in accordance with an embodiment of the present disclosure.

Referring to FIG. 4, a portion of a back contact solar cell 400 includes a substrate 402 having a light-receiving surface 404 and a back surface 406. In an embodiment, the substrate 402 is an N-type monocrystalline silicon substrate. A P-type emitter region 408 is disposed on a first thin dielectric layer 410 disposed on the back surface 406 of the substrate 402. The P-type emitter region includes semiconductor structure 316 described in association with FIGS. 3G and 3G'. An N-type polycrystalline silicon emitter region 412 is disposed on a second thin dielectric layer 414 disposed on the back surface 406 of the substrate 102. A third thin dielectric layer 416 is disposed laterally directly between the P-type 408 and N-type 412 polycrystalline silicon emitter regions. A first conductive contact structure 418 is disposed on the P-type emitter region 408. A second conductive contact structure 420 is disposed on the N-type polycrystalline silicon emitter region 412.

Referring again to FIG. 4, in an embodiment, the solar cell 400 further includes an insulator layer 422 disposed on the P-type emitter region 408. The first conductive contact structure 418 is disposed through the insulator layer 422. Additionally, a portion of the N-type polycrystalline silicon emitter region 412 overlaps the insulator layer 422 but is separate from the first conductive contact structure 418. In an embodiment, an additional N-type polycrystalline silicon layer 424 is disposed on the insulator layer 422, and the first conductive contact structure 418 is disposed through the N-type polycrystalline silicon layer 424 and through the insulator layer 422, as is depicted in FIG. 4. In one such embodiment, the additional N-type polycrystalline silicon layer 424 and the N-type polycrystalline silicon emitter region 412 are formed from a same layer that is blanket deposited and then scribed to provide scribe lines 426 therein.

Referring again to FIG. 4, in an embodiment, the solar cell 400 further includes a recess 428 disposed in the back surface 406 of the substrate 402. The N-type polycrystalline silicon emitter region 412 and the second thin dielectric layer 414 are disposed in the recess 428. In one such embodiment, the recess 428 has a texturized surface, and the N-type polycrystalline silicon emitter region 412 and the second thin dielectric layer 414 are conformal with the texturized surface, as is depicted in FIG. 4. In an embodiment, then, the P-type emitter region 408 and the first thin dielectric layer 410 are disposed on a flat portion of the back surface 406 of the substrate 402, and the N-type polycrystalline silicon emitter region 412 and the second thin dielectric layer 414 are disposed on a texturized portion of the back surface 406 of the substrate, as is depicted in FIG. 4. It is to be appreciated, however, that other embodiments may not include a texturized surface, or may not include a recess altogether.

Referring again to FIG. 4, in an embodiment, the solar cell 400 further includes a fourth thin dielectric layer 430 disposed on the light-receiving surface 404 of the substrate 402. An N-type polycrystalline silicon layer 432 is disposed on the fourth thin dielectric layer 432. An anti-reflective coating (ARC) layer 434, such as a layer of silicon nitride, is disposed on the polycrystalline silicon layer 432. In one such embodiment, as described in greater detail below, the fourth thin dielectric layer 432 is formed by essentially the same process used to form the second thin dielectric layer 414, and the N-type polycrystalline silicon layer 432 is formed by essentially the same process used to form the N-type polycrystalline silicon emitter region 412.

In an embodiment, the first thin dielectric layer 410, the second thin dielectric layer 414 and the third thin dielectric layer 416 include silicon dioxide. However, in another embodiment, the first thin dielectric layer 410 and the second thin dielectric layer 414 include silicon dioxide, while the third thin dielectric layer 416 includes silicon nitride. In an embodiment, insulator layer 422 includes silicon dioxide.

In an embodiment, the first conductive contact structure 418 and the second conductive contact structure 420 each include an aluminum-based metal seed layer disposed on the P-type 408 and N-type 412 emitter regions, respectively. In one embodiment, each of the first conductive contact structure 418 and the second conductive contact structure 420 further includes a metal layer, such as a copper layer, disposed on the aluminum-based metal seed layer.

Figure 5A:
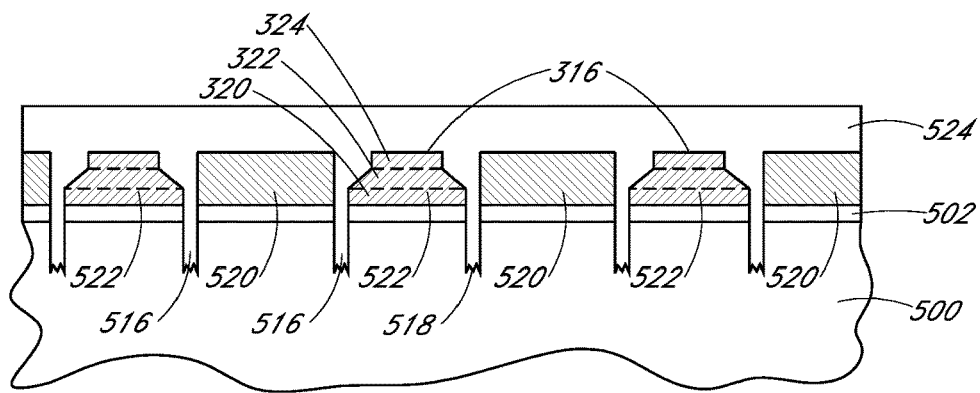
FIGS. 5A-5C illustrate cross-sectional views of various processing operations in a method of fabricating a solar cell, in accordance with an embodiment of the present disclosure.
Figure 5B:
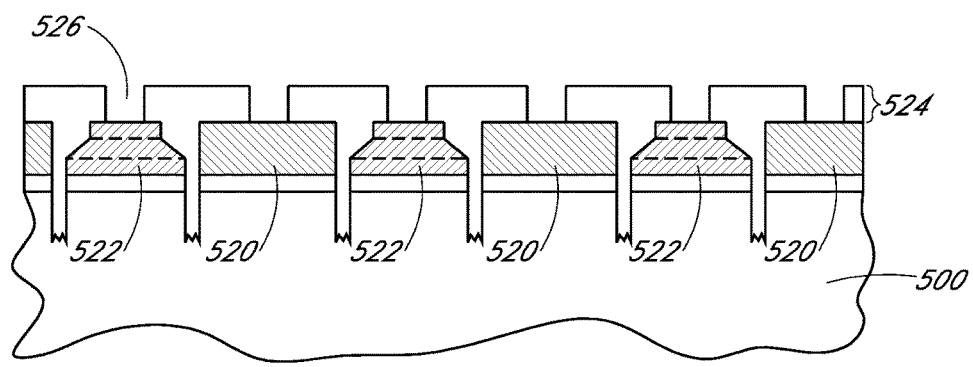
Figure 5C:
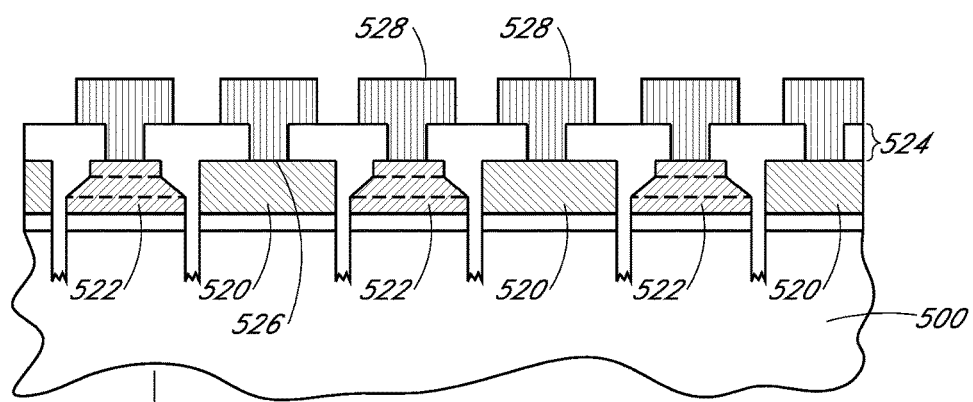

In another aspect, a solar cell has non-differentiated P-type and N-type architectures. FIGS. 5A-5C illustrate cross-sectional views of various processing operations in a method of fabricating a solar cell, in accordance with an embodiment of the present disclosure. It is to be appreciated that although the structure of FIG. 3G' is effectively utilized in the FIGS. 5A-5C, the structure of FIG. 3G may instead be included in that residual mask material 350 may be retained on the semiconductor structure 316.

Referring to FIG. 5A, a method of forming contacts for a back-contact solar cell includes forming a thin dielectric layer 502 on a substrate 500.

In an embodiment, the thin dielectric layer 502 is composed of silicon dioxide and has a thickness approximately in the range of 5-50 Angstroms. In one embodiment, the thin dielectric layer 502 ultimately performs as a tunneling oxide layer in a functioning solar cell. In an example, the dielectric layer 502 may be an amorphous dielectric layer. An amorphous dielectric layer may be formed by oxidation of a silicon substrate (e.g., via PECVD). Oxidation of the silicon layer may involve, for example, plasma oxidation and/or radical oxidation. In an embodiment, substrate 500 is a bulk single-crystal substrate, such as an N-type doped single crystalline silicon substrate. However, in an alternative embodiment, substrate 500 includes a polycrystalline silicon layer disposed on a global solar cell substrate.

Referring again to FIG. 5A, trenches 516 are formed between N-type doped polysilicon regions 520 and P-type semiconductor regions 522. The P-type semiconductor regions 522 are based on the semiconductor structure 316, described in association with FIGS. 3G and 3G'. Portions of the trenches 516 can be texturized to have textured features 518, as is also depicted in FIG. 5A.

Referring again to FIG. 5A, an insulating layer 524 is formed above the plurality of N-type doped polysilicon regions 520, the plurality of P-type semiconductor regions 522, and the portions of substrate 500 exposed by trenches 516. In one embodiment, a lower surface of the insulating layer 524 is formed conformal with the plurality of N-type doped polysilicon regions 520, the plurality of P-type semiconductor regions 522, and the exposed portions of substrate 500, while an upper surface of insulating layer 524 is substantially flat, as depicted in FIG. 5A.

Referring to FIG. 5B, a plurality of contact openings 526 is formed in the insulating layer 524. The plurality of contact openings 526 provide exposure to the plurality of N-type doped polysilicon regions 520 and to the plurality of P-type semiconductor regions 522. In one embodiment, the plurality of contact openings 526 is formed by laser ablation. In one embodiment, the contact openings 526 to the N-type doped polysilicon regions 520 have substantially the same height as the contact openings to the P-type semiconductor regions 522, as depicted in FIG. 5B.

Referring to FIG. 5C, the method of forming contacts for the back-contact solar cell further includes forming conductive contacts 528 in the plurality of contact openings 526 and coupled to the plurality of N-type doped polysilicon regions 520 and to the plurality of P-type semiconductor regions 522. In an embodiment, conductive contacts 528 are formed on or above a surface of a bulk N-type silicon substrate 500 opposing a light receiving surface 501 of the bulk N-type silicon substrate 500. In a specific embodiment, the conductive contacts are formed on regions (522/520) above the surface of the substrate 500, as depicted in FIG. 5C. The fabrication of the conductive contacts can involve use of one or more sputtered, plated or bonded conductive layers.

In an embodiment, the plurality of conductive contacts 528 are formed by forming a metal seed layer and then performing an electroplating process. In one embodiment, the seed layer is formed by a deposition, lithographic, and etch approach. A metal layer is then electroplated on the patterned metal seed layer. In another embodiment, the plurality of conductive contacts 528 is formed by printing a paste. The paste may be composed of a solvent and the aluminum/silicon (Al/Si) alloy particles. A subsequent electroplating or electroless-plating process may then be performed.

In an embodiment, the plurality of conductive contacts 528 is formed by first forming a metal seed layer and then forming a metal foil layer. In an embodiment, the metal seed layer includes a layer having a thickness approximately in the range of 0.05 to 20 microns and includes aluminum in an amount greater than approximately 90 atomic %. In an embodiment, the metal seed layer is deposited as a blanket layer which is later patterned. In another embodiment, the metal seed layer is deposited as patterned layer. In one such embodiment, the patterned metal seed layer is deposited by printing the patterned metal seed layer.

In an embodiment, the metal foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In another embodiment, a metal wire formed on the metal seed layer. In one such embodiment, the wire is an aluminum (Al) or copper (Cu) wire. In either case, the metal foil or wire may be welded to the metal seed layer. In the case of a metal foil layer, the metal foil may subsequently be patterned, e.g., by laser ablation and/or etching. Such patterning may position metal foil portions at regions in alignment with locations between the plurality of semiconductor regions 520 and 522.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, tri-layer semiconductor stacks for patterning features on solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
   forming a first semiconductor layer above a substrate;
   forming a P-type semiconductor layer directly on the first semiconductor layer;
   forming a third semiconductor layer directly on the P-type semiconductor layer;
   forming a mask layer directly on the third semiconductor layer;
   patterning the mask layer;
   etching the third semiconductor layer, the P-type semiconductor layer, and the first semiconductor layer to provide a semiconductor structure having an outermost edge of the third semiconductor layer laterally recessed from an outermost edge of the first semiconductor layer by a width, and an outermost edge of the P-type semiconductor layer sloped from the outermost edge of the first semiconductor layer to the outermost edge of the third semiconductor layer;
   wherein the first semiconductor layer is a first intrinsic silicon layer, the P-type semiconductor layer is a boron-doped silicon layer, and the third semiconductor layer is a second intrinsic silicon layer.

2. The method of claim 1, further comprising:
   laser ablating an opening in the mask layer to expose a portion of the semiconductor structure.

3. The method of claim 2, further comprising:
   forming a conductive contact structure in the opening.

4. The method of claim 3, further comprising:
   prior to forming the conductive contact structure, annealing the semiconductor structure.

5. The method of claim 2, wherein the laser ablating penetrates a portion of the third semiconductor layer but does not penetrate through to the P-type semiconductor layer.

6. The method of claim 1, wherein etching the third semiconductor layer, the P-type semiconductor layer, and the first semiconductor layer comprising using a wet etchant selected from the group consisting of an aqueous solution of TMAH and an aqueous solution of KOH.

7. A method of fabricating a solar cell, the method comprising:
   forming a semiconductor structure above a substrate, the semiconductor structure comprising a P-type semiconductor layer formed directly on a first semiconductor layer, and a third semiconductor layer formed directly on the P-type semiconductor layer, wherein an outermost edge of the third semiconductor layer is laterally recessed from an outermost edge of the first semiconductor layer by a width, and wherein an outermost edge of the P-type semiconductor layer is sloped from the outermost edge of the first semiconductor layer to the outermost edge of the third semiconductor layer; and
   forming a conductive contact structure electrically connected to the semiconductor structure, wherein the semiconductor structure is vertically stacked with the first semiconductor layer between the P-type semiconductor layer and the substrate, the P-type semiconductor layer between the first and third semiconductor layers, and the third semiconductor layer between the P-type semiconductor layer and the conductive contact structure;
   wherein the first semiconductor layer is a first intrinsic silicon layer, the P-type semiconductor layer is a boron-doped silicon layer, and the third semiconductor layer is a second intrinsic silicon layer.

8. The method of claim 7, wherein the first semiconductor layer has a thickness approximately equal to a thickness of the P-type semiconductor layer and approximately equal to a thickness of the third semiconductor layer.

9. The method of claim 7, wherein the P-type semiconductor layer has a thickness greater than approximately 10% but less than approximately 90% of a total thickness of the semiconductor structure.

10. The method of claim 7, wherein none of the first semiconductor layer, the P-type semiconductor layer, and the third semiconductor layer has a thickness less than approximately 10% of a total thickness of the semiconductor structure.

11. The method of claim 10, wherein the first intrinsic silicon layer, the P-type semiconductor layer, and the second intrinsic silicon layer are amorphous layers.

12. The method of claim 10, wherein the first intrinsic silicon layer, the P-type semiconductor layer, and the second intrinsic silicon layer are polycrystalline layers.

13. The method of claim 10, wherein the first intrinsic silicon layer and the second intrinsic silicon layers each have a total dopant concentration of less than approximately 1E18 atoms/cm$^3$, and the P-type semiconductor layer has a total boron concentration of greater than approximately 2E19 atoms/cm$^3$.

14. The method of claim 7, wherein the semiconductor structure is formed on a tunneling dielectric layer formed on the substrate.

15. The method of claim 7, wherein the conductive contact structure is formed in an opening of an anti-reflective coating layer formed over the semiconductor structure.

16. The method of claim 7, wherein the semiconductor structure is an emitter region of the solar cell.

17. A method of fabricating a solar cell, the method comprising:
   forming a semiconductor structure above a substrate, the semiconductor structure comprising a second semiconductor layer formed directly on a first semiconductor layer, and a third semiconductor layer formed directly on the second semiconductor layer, wherein an outermost edge of the third semiconductor layer has a non-reentrant profile, an outermost edge of the second semiconductor layer has a non-reentrant profile extending beyond the outermost edge of the third semiconductor layer by a width, and an outermost edge of the first semiconductor layer has a non-reentrant profile and does not undercut the second semiconductor layer, and wherein the non-reentrant profiles of the first and third semiconductor layers are steeper than the non-reentrant profile of the second semiconductor layer; and forming a conductive contact structure electrically connected to the semiconductor structure, wherein the semiconductor structure is vertically stacked with the first semiconductor layer between the second semiconductor layer and the substrate, the second semiconductor layer between the first and third semiconductor layers, and the third semiconductor layer between the second semiconductor layer and the conductive contact structure;

wherein the first semiconductor layer is a first intrinsic silicon layer, the second semiconductor layer is a P-type boron doped silicon layer, and the third semiconductor layer is a second intrinsic silicon layer.

18. The method of claim 17, wherein the first and the third semiconductor layers each have a total dopant concentration of less than approximately 1E18 atoms/cm$^3$, and the P-type silicon layer has a total boron concentration of greater than approximately 2E19 atoms/cm$^3$.

19. The method of claim 17, wherein the first semiconductor layer has a thickness approximately equal to a thickness of the third semiconductor layer.

20. The method of claim 17, wherein the second semiconductor layer has a thickness greater than approximately 10% but less than approximately 90% of a total.

* * * * *